United States Patent [19]
Caravella et al.

[11] Patent Number: 5,953,251
[45] Date of Patent: Sep. 14, 1999

[54] PROGRAMMING METHOD FOR NONVOLATILE MEMORIES

[75] Inventors: James S. Caravella; Jeremy W. Moore, both of Chandler, Ariz.

[73] Assignee: Motorola, Inc., Schaumburg, Ill.

[21] Appl. No.: 09/215,933

[22] Filed: Dec. 18, 1998

[51] Int. Cl.[6] .................................................. G11C 7/00
[52] U.S. Cl. .............................. 365/185.18; 365/185.24; 365/185.28
[58] Field of Search ...................... 365/185.18, 185.24, 365/185.28, 185.29

[56] References Cited

U.S. PATENT DOCUMENTS

| 5,047,981 | 9/1991 | Gill et al. ................................ 365/218 |
| 5,432,738 | 7/1995 | Watsuji et al. ...................... 365/185.28 |
| 5,790,456 | 8/1998 | Haddad ............................... 365/185.28 |

*Primary Examiner*—Vu A. Le
*Attorney, Agent, or Firm*—Robert F. Hightower

[57] ABSTRACT

A programming method for a floating gate memory circuit (100) includes a block erase (step 81) in which a first programming signal is applied to memory cells of a selected block of the memory to store a first value of charge in the memory cells of the block. Data is programmed by applying a second programming signal to a first memory cell to store a second value in the first memory cell (step 83). A third programming signal is applied to a second memory cell to write a correction charge that compensates for a change in the first value of charge induced by the second programming signal (step 84).

18 Claims, 2 Drawing Sheets

PROGRAMMING METHOD FOR NONVOLATILE MEMORIES

BACKGROUND OF THE INVENTION

The present invention relates in general to semiconductors, and more particularly to nonvolatile memory circuits.

Electrically erasable floating gate memories are semiconductor devices that store data as charges on the floating gates of storage transistors and retain the data after power is removed. The data is written by applying high voltage pulses to a word line of the memory to induce a charge flow to the transistor's floating gate. The charge flow controls a conduction threshold of the transistor to set a cell current that is sensed to read the stored data.

When prior art memory circuits are programmed, the high voltage pulses applied to one transistor can alter the charges stored in other transistors coupled to the same word line. As a result, the conduction thresholds are altered, which reduces cell margins and causes data to be read incorrectly. Hence, prior art programming methods result in a memory with reduced reliability.

Hence, a memory programming method is needed that increases reliability by maintaining high cell margins.

DETAILED DESCRIPTION OF THE DRAWINGS

Figure 1:
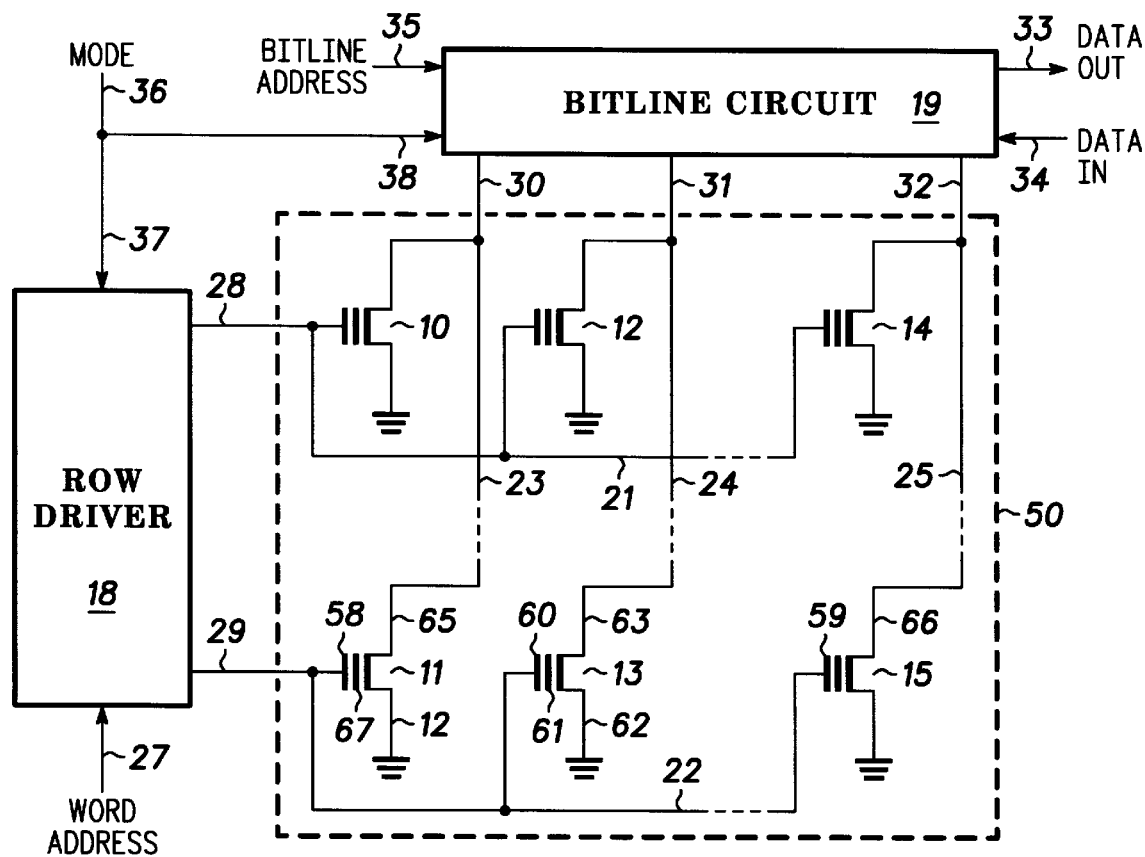
FIG. 1 schematically illustrates a memory circuit in accordance with the present invention.

FIG. 1 schematically illustrates an electrically erasable memory circuit 100 for storing and retrieving data. A block 50 of memory cells includes transistors 10, 11, 12, 13, 14 and 15, that function as data storage elements. Similar memory circuits can be configured with additional blocks to increase their storage capacity. Transistors 10–15 are coupled in a matrix fashion, as described hereinafter, to rows or word lines 21 and 22 and columns or bit lines 23, 24, and 25 so as to be selectable. A row driver 18 provide selection and programming signals, as described hereinafter, on outputs 28 and 29 to select word lines 21 and 22, respectively. A bitline circuit 19 has nodes 30, 31, and 32 for selecting among bitlines 23–25.

Transistors 10–15 are configured as floating gate transistors having similar or identical structures. Hence, a description of the operation of one transistor, such as transistor 13, is applicable to transistors 10–12 and 14–15. Transistor 13 has a control gate 60 coupled to word line 22 for receiving the programming and selection signals. The programming and selection signals provided on word line 22 are also applied to control gates 58 and 59 of transistors 11 and 15, respectively.

Memory circuit 100 operates in either of two modes, as determined by a MODE signal 36 received by row driver 18 at a mode input 37, and also received by bitline circuit 19 at a mode input 38. In the programming mode, data is written into memory circuit 100. In the read mode, stored data is read from memory circuit 100.

Memory circuit 100 functions in the read mode as follows. Assume data is being read from transistor 13. A WORD ADDRESS signal is received at an address input 27 of row driver 18. Driver 18 decodes the value presented by the WORD ADDRESS signal and provides a selection signal on line 22 whose amplitude is about three volts. A BITLINE ADDRESS is received at an address input 35 of bitline circuit 19. Circuit 19 includes sense amplifiers coupled to bitlines 30–32 to receive current signals from transistors 10–15. Circuit 19 further includes a decoder for decoding the value presented at input 35 to activate or select a sense amplifier of bitline circuit 19. For example, to read data from transistor 13, the selected sense amplifier senses a cell current through transistor 13 to determine the stored data value. Bitline circuit 19 provides the data at an output 33 as DATA OUT. Such selection and conversions of cell current to data output are well known to those skilled in the art.

The selection signal on word line 22 is applied to a control gate 60 of transistor 13. If the conduction threshold of transistor 13 is lower than the three volts applied to line 22, a channel between a source 62 and a drain 63 of transistor 13 is formed to provide a conduction path for cell current through transistor 13 to bitline 24. If the conduction threshold exceeds three volts, a channel is not formed, and little or no current flows through transistor 13. The conduction threshold is set by a charge stored on floating gate 61 that represents the value of the data. Transistors 11 and 15 may also conduct current, depending on the values of data stored on their floating gates, but the corresponding sense amplifiers of circuit 19 are not selected.

Figure 2:
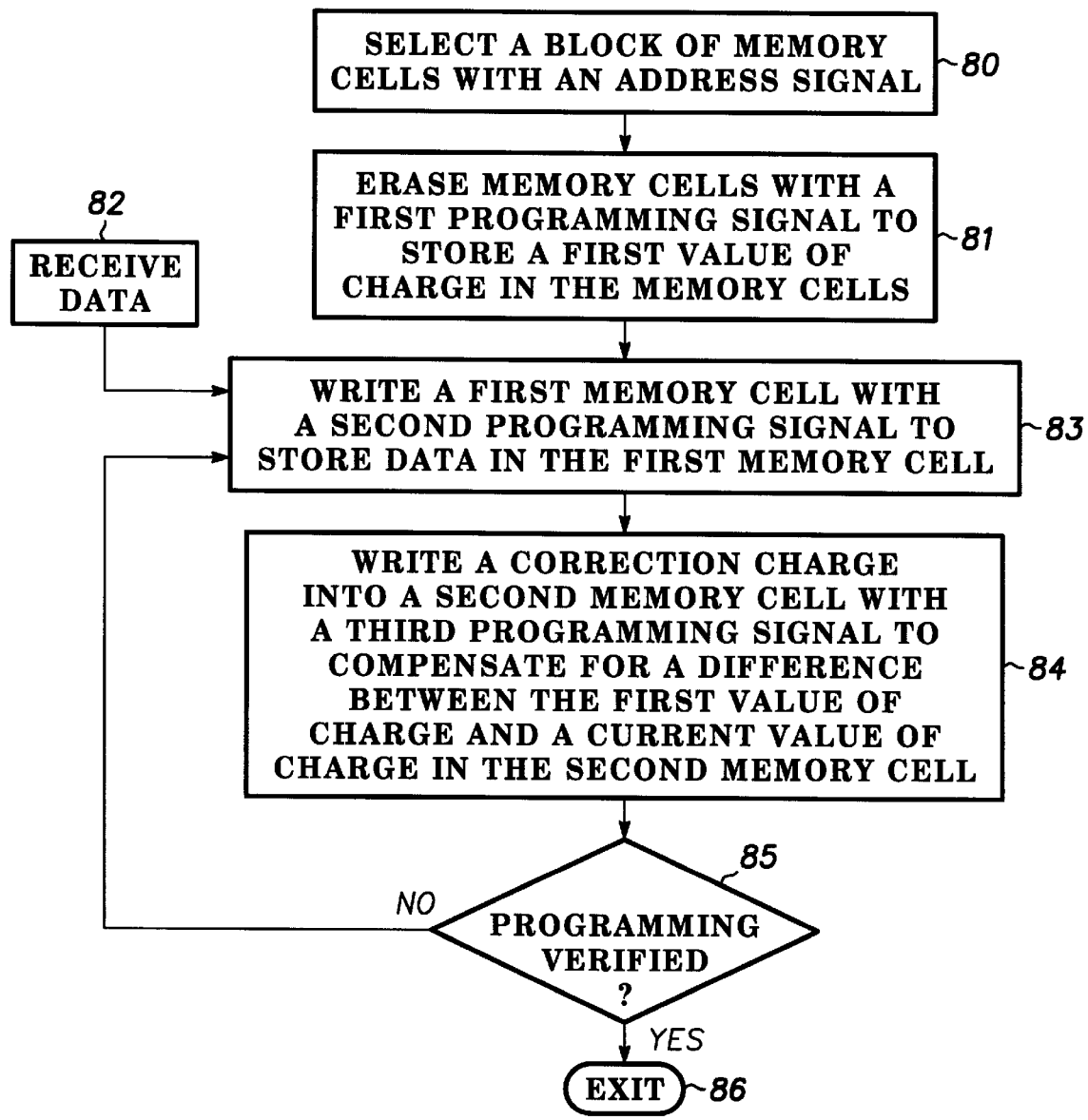
FIG. 2 illustrates a flow chart of a method of programming the memory circuit of FIG. 1 in accordance with the present invention.

The steps for operating memory circuit 100 in the programming mode are shown in the flow diagram of FIG. 2, including steps 80 through 86. A logic zero value is written by transferring an electron charge to a floating gate, while a logic one value is written by removing or transferring the charge from the floating gate. To simplify the description, assume that transistor 13 is to be programmed to store a logic one while transistors 10–12 and 14–15 are to be programmed to store a logic zero.

Methods for transferring electron charges to or from a floating gate are well known in the art and include the Fowler-Norheim and hot carrier injection methods. These methods rely on applying high voltage programming pulses between a conduction electrode and a control gate of a storage transistor to induce a tunneling current through a gate dielectric of the transistor. The direction of charge transfer depends on the polarity of the programming pulses, and the total charge is a function of the amplitude and total time that the high voltage programming pulses are applied. Typically, programming pulses are about one hundred microseconds long and are repeated to subject the programmed transistors to the high voltage pulses for a cumulative total of about two milliseconds. The specific pulse widths and number of pulses can be determined by characterizing the manufacturing process or, in the alternative, the cell current can be sensed after applying each pulse to ensure that an adequate charge is being stored.

The programming of memory circuit 100 proceeds as follows. At step 80, block 50 is selected with WORD ADDRESS data received at input 27 of row driver 18 to produce programming signals on word lines 21–22 as will be described. The term "block" refers to memory cells coupled to particular word lines. Hence, word lines 21 and 22 are selected concurrently to select block 50, i.e., transistors 10–15. In an alternative embodiment, where only one word line at a time is selected, a block refers to the transistors coupled to that word line. As yet a further embodiment, a memory circuit can include multiple blocks. For example, memory circuit 100 may have another block similar to block 50. Thus, driver 18 may have two additional outputs that function similar to outputs 28–29, and/or nodes 30–32 may be coupled to additional devices.

At step 81, block 50 is erased by applying a first programming signal, as described hereinafter, to word lines 21–22 to transfer a first value of charge to transistors 10–15. Such erasing has the effect of concurrently writing a common value such as a value of logic zero in transistors 10–15 of selected block 50. Accordingly, step 81 is referred to as a block erase step.

The first programming signal includes programming pulses that apply a voltage value of twelve volts to word lines 21–22 while negative five volt pulses are provided on bitlines 23–25. Hence, the first programming signal effectively applies programming pulses whose magnitude is seventeen volts between the drains and control gates of transistors 10–15. In particular, seventeen volt pulses are applied between drain 63 and control gate 60 to transfer a charge to floating gate 61 to raise the conduction threshold of transistor 13 above three volts. The pulse widths and number of pulses are set during characterization or by testing memory circuit 100 as pulses are applied, as previously described. Transistors 10–12 and 14–15 are concurrently erased in a similar fashion.

When step 81 has been completed, a logic zero is stored in each of the transistors 10–15. Hence, it is only necessary to write a logic one in a selected portion of transistors 10–15 to program data in memory circuit 100. At step 82, information to be stored in memory circuit 100 is presented as a DATA IN signal and is received at an input 34 of bitline decoder 19. Individual bits of DATA IN are aligned with nodes 30–32 to set the values of programming pulses applied to bitlines 23–25 to control the memory cells to be programmed to store logic one values.

At step 83, a second programming signal is applied to transistor 13 to write a logic one value, as set by the information in DATA IN. The second programming signal includes programming pulses that apply negative nine volts to word line 22 and control gate 60 while programming pulses of positive five volts are applied to bitline 24 and drain 63. Hence, programming pulses of negative fourteen volts are effectively applied from control gate 60 to drain 63. The pulse widths and number of pulses are set during characterization or by testing, as has been described. The second programming signal transfers the charge stored on floating gate 61 to reduce the conduction threshold of transistor 13 below three volts. Note that in contrast with the erase operation of step 81, which erases a block of memory cells concurrently, step 83 writes logic one values into memory cells individually.

In order to avoid programming transistors 10–12 and 14–15 while transistor 13 is being programmed, bitline circuit 19 applies ground potential to bitlines 23 and 25 while row driver 18 applies a potential of about 2.5 volts to word line 21. Hence, the voltage across transistors 10 and 14 is 2.5 volts while the voltage across transistor 12 is 2.5 volts. Such voltages result in little or no charge being transferred from transistors 10, 12, and 14. However, the voltage across transistors 11 and 15 is negative nine volts, which can cause an undesirable charge transfer from transistors 11 and 15 that occurs at a slower rate than the charge transfer from transistor 13. Hence, a portion of the stored charge is transferred, but not enough to write logic one values in transistors 11 and 15. However, the charge transferred is adequate to lower the conduction thresholds of transistors 11 and 15, which reduces the sense or read margin and can therefore be referred to as a disturb condition. As each memory cell on word line 22 is programmed to store a logic one, more charge is transferred from the other transistors on word line 22.

To maintain acceptable read margins, prior art memories limit the number of memory cells on each word line in order to limit the overall time memory cells are subjected to the negative nine volt pulses. Hence, the prior art memories need more word lines to achieve a given storage capacity, which increases circuit complexity and die size.

Step 84 is a correction procedure that improves the read margin of memory circuit 100. At step 84, a third programming signal is applied to transistor 11 to write a correction charge on floating gate 67 to restore the charge transferred from transistor 11 during step 83. A similar programming signal is applied to write a correction charge in transistor 15. The correction charge raises the conduction threshold to its level after step 82, thereby compensating for a difference between the charge originally stored during step 81 and a current value of charge remaining after transistor 13 is programmed at step 83.

The third programming signal includes programming pulses that apply twelve volts to control gate 58 while ground potential is applied to drain 65. The twelve volt programming pulses of step 84 are less than the seventeen volt programming pulses used in step 81, so step 84 is referred to as a mild erase step. In contrast with step 81, the mild erase of step 84 is applied to memory cells individually, rather than as a selected block. To avoid writing a correction charge in transistor 13, bitline circuit 19 applies five volts to bitline 24.

Note that step 83 often causes more charge to be transferred from faster responding memory cells than from slower cells, rendering the faster cells more prone to disturbs. However, for a given duration of the third programming signal, the faster cells receive larger correction charges to compensate, due to the same mechanism that causes charge to be transferred from these cells at the faster rate.

The correction procedure of step 84 can be performed not only after step 83 as shown in FIG. 2, but also at other points in the programming method. For example, step 84 can be performed prior to step 83 to effectively precharge transistors 11, 13, and 15 with the correction charge. When step 83 is performed, the correction charge is removed with the negative nine volt pulses to provide the desired conduction thresholds.

At step 85, the data stored in transistors 11, 13, and 15 is read to verify that transistors 11, 13 and 15 have been correctly programmed. If the data is correct, the process terminates at step 86. If not, the process loops back to step 83 to repeat the cycle.

By now it should be appreciated that there has been provided a programming method for a floating gate memory that increases reliability that reduces disturbs by storing data with higher read margins. Memory cells of a selected block of the memory are block erased with a first programming signal to store a first value of charge in the memory cells. Data is written into a first memory cell with a second programming signal to store a second value of charge that is different from the first value. A correction charge is written into a second memory cell with a third programming signal to compensate for a difference between the first value of charge and a current value of charge stored in the second memory cell. The programming method maintains high read margins as the number of memory cells coupled to a word line is increased, thereby reducing circuit complexity and the cost of the memory while maintaining a high level of reliability.

We claim:

1. A method of programming a memory, comprising the steps of:
    writing to the memory with a first programming signal to store a first value as a stored charge in a first storage element of the memory, and to store the first value in a second storage element of the memory;
    writing to the memory with a second programming signal to store a second value in the second storage element; and
    writing to the first storage element with a third programming signal to store a correction charge to compensate for a change in the stored charge induced by the second programming signal.

2. The method of claim 1, further comprising the step of selecting the first and second storage elements with an address signal.

3. The method of claim 1, wherein the step of writing to the memory with the first programming signal includes the step of block erasing the memory with the first programming signal.

4. The method of claim 3, wherein the step of writing to the memory includes the step of accumulating the stored charge on a floating gate of the first storage element.

5. The method of claim 1 wherein the step of writing to the memory with a second programming signal includes the step of storing a second value different from the first value in the second storage element.

6. The method of claim 5 wherein the step of writing to the first storage element with a third programming signal includes the step of storing a correction charge in the first storage element to compensate for the change in the first stored charge.

7. The method of claim 1, further comprising the step of generating the third programming signal to have an amplitude less than an amplitude of the first programming signal.

8. A method of programming a memory, comprising the steps of:
    erasing memory cells of the memory with a first programming signal to store a first value of charge in the memory cells;
    writing a first memory cell with a second programming signal to store a second value of charge in the first memory cell, where the second value is different from the first value; and
    writing a correction charge into a second memory cell with a third programming signal to compensate for a difference between the first value of charge and a current value of charge stored in the second memory cell.

9. The method of claim 8, further comprising the step of addressing the memory to select the first and second memory cells.

10. The method of claim 8, wherein the step of erasing includes the step of storing the first value of charge on floating gates of the first and second memory cells.

11. The method of claim 8, wherein the second programming signal induces a current that alters the first value of charge stored in the second memory cell to produce the current value of charge stored in the second memory cell.

12. A method of programming a memory, comprising the steps of:
    storing a first value in memory cells of the memory with a first programming signal;
    storing a second value in a first memory cell of the memory with a second programming signal, where the second value is different from the first value; and
    storing a correction value in a second memory cell of the memory with a third programming signal to adjust for a change in a value stored in the second memory cell produced by the second programming signal.

13. The method of claim 12, wherein the step of storing a first value includes the step of storing a first charge on a floating gate of the first memory cell.

14. The method of claim 13, wherein the step of storing the second value includes the step of storing the second charge on a floating gate of the first memory cell.

15. The method of claim 14, wherein the step of storing a correction value includes the step of storing the correction charge on the floating gate of the second memory cell.

16. The method of claim 15, wherein the step of storing a second value includes the step of inducing a charge transfer in the second memory cell with the second programming signal.

17. The method of claim 12, wherein the step of storing a first value includes the step of erasing the memory cells of the memory.

18. The method of claim 17, wherein the step of erasing includes the step of concurrently erasing the first and second memory cells with the first programming signal.

* * * * *